United States Patent [19]

Sato et al.

[11] Patent Number: 5,667,701
[45] Date of Patent: Sep. 16, 1997

[54] METHOD OF MEASURING THE AMOUNT OF CAPACITIVE COUPLING OF RF POWER IN AN INDUCTIVELY COUPLED PLASMA

[75] Inventors: Arthur Sato, Santa Clara; Xue-Yu Qian, Milpitas, both of Calif.

[73] Assignee: Applied Materials, Inc., Santa Clara, Calif.

[21] Appl. No.: 475,878

[22] Filed: Jun. 7, 1995

[51] Int. Cl.[6] .................................................. H01L 21/822
[52] U.S. Cl. .......................... 216/61; 216/68; 156/345; 118/690; 438/17
[58] Field of Search .................... 156/345, 626.11, 156/627.1; 216/59, 61, 68, 71; 118/723 IR

[56] References Cited

U.S. PATENT DOCUMENTS 4,316,791  2/1982  Taillet ........................................ 204/298
5,167,748 12/1992  Hall ........................................... 156/345
5,458,732 10/1995  Butler et al. ............................... 216/61
5,534,231  7/1996  Savas ......................................... 216/67
5,539,609  7/1996  Collins et al. ............................ 361/234
5,556,549  9/1996  Patrick et al. ............................. 156/345

*Primary Examiner*—R. Bruce Breneman
*Assistant Examiner*—George Goudreau
*Attorney, Agent, or Firm*—Michaelson & Wallace

[57] ABSTRACT

The amount of capacitive coupling of RF power to a semiconductor substrate or wafer in an inductively coupled RF plasma reactor is quantitatively measured by separating the RF current from the plasma through the wafer pedestal into the Fourier components including the fundamental frequency (F) of the RF power and the second harmonic (2F) of the frequency of the RF power and then measuring the current or power of the fundamental component. As an additional feature, the amount of inductive coupling is measured by measuring the current or power of the second harmonic.

20 Claims, 1 Drawing Sheet

METHOD OF MEASURING THE AMOUNT OF CAPACITIVE COUPLING OF RF POWER IN AN INDUCTIVELY COUPLED PLASMA

BACKGROUND OF THE INVENTION

1. Technical Field

The invention is related to a method of quantitatively measuring the amount of capacitive coupling of RF power in an inductively coupled plasma, and in particular to measuring the amount of capacitive coupling of RF power to a semiconductor wafer in an inductively coupled RF plasma reactor.

2. Background Art

In various plasma processes carried out in semiconductor wafer processing, precise control of ion bombardment energy at the wafer surface is crucial to process performance. For example, etching a polysilicon layer formed over a thin oxide layer (e.g., the gate oxide layer) requires high polysilicon selectivity and etch anisotropy during the entire process. This in turn requires a narrow distribution of plasma ion energy about an optimum ion energy. A problem is that capacitive coupling in an otherwise inductively coupled plasma broadens the plasma ion energy distribution, thereby reducing process performance. Therefore it would be helpful to measure the amount of capacitive coupling and the amount of inductive coupling in an inductively coupled plasma. However, there is no known method for quantitatively measuring the amount of capacitive coupling of RF power in an inductively coupled plasma.

It is therefore a principal object of the invention to provide a method of quantitatively measuring the amount of capacitive coupling in an inductively coupled RF plasma.

SUMMARY OF THE DISCLOSURE

The amount of capacitive coupling of RF power to a semiconductor substrate or wafer in an inductively coupled RF plasma reactor is quantitatively measured by separating the RF current from the plasma through the wafer pedestal into the Fourier components including the fundamental frequency (F) of the RF power and the second harmonic (2F) of the frequency of the RF power and then measuring the current or power of the fundamental component. As an additional feature, the amount of inductive coupling is measured by measuring the current or power of the second harmonic.

DETAILED DESCRIPTION OF THE PREFERRED EMBODIMENTS

Figure 1:
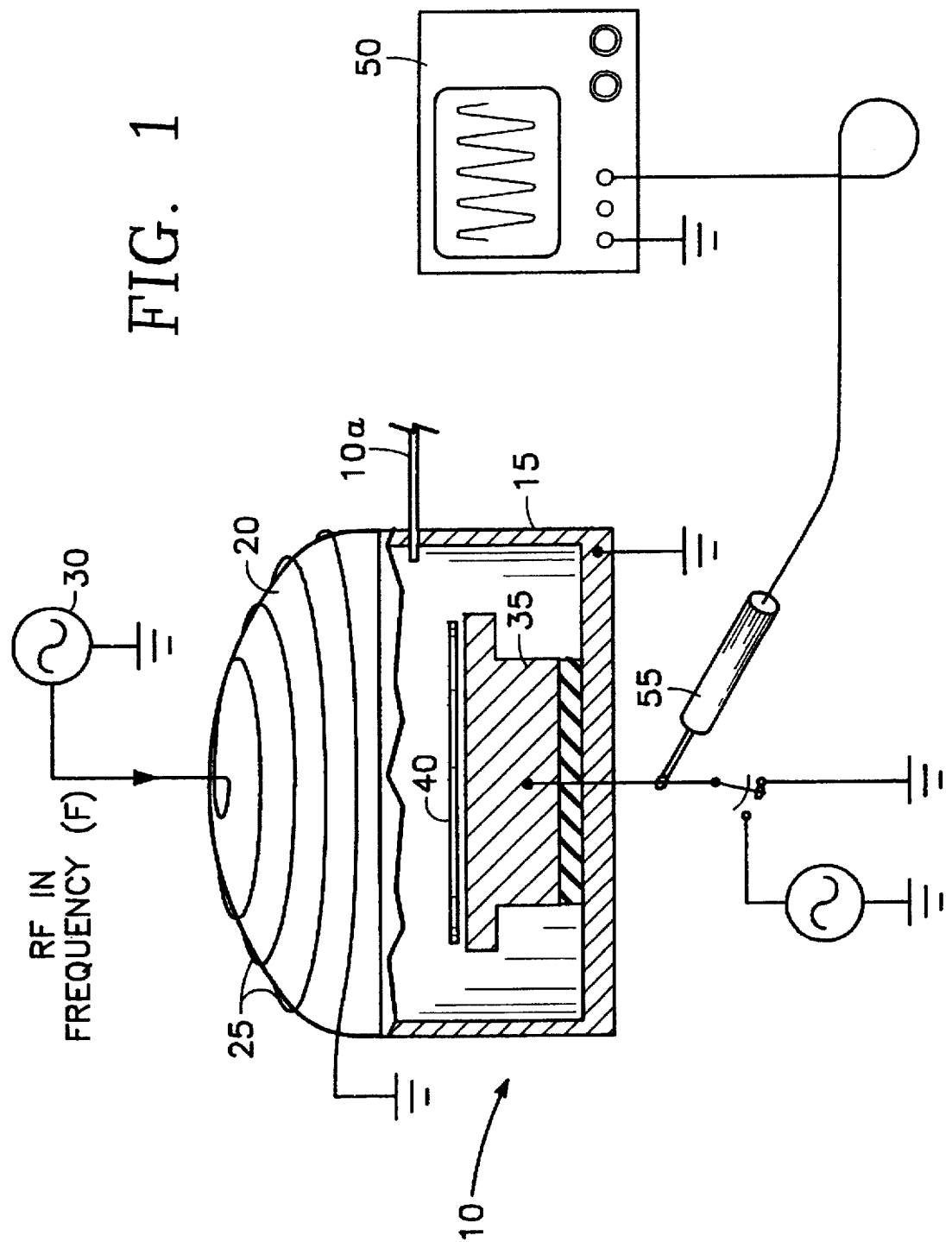
FIG. 1 is a simplified schematic diagram depicting apparatus for carrying out the method of measuring the amount of capacitive coupling in an inductively coupled plasma.

FIG. 1 illustrates an inductively coupled plasma reactor including a chamber 10 having a cylindrical side wall 15 and a dome-shaped ceiling 20 supporting an inductive coil 25. A plasma source power supply 30 is connected to the inductive coil 25. A wafer pedestal 35 supports a semiconductor wafer 40 inside the chamber 10. Gas introduced into the chamber 10 through a gas inlet 10a is ionized to produce a plasma over the wafer 40. The plasma ion energy at the wafer surface is controlled by a bias RF power source connected to the wafer pedestal 35 within a narrow energy band centered at a desired ion energy level. The problem is that stray capacitance from the coil 25 to the plasma broadens the distribution of the ion energy.

In order to quantitatively measure the amount of capacitive coupling to the plasma, a frequency discriminating device, such as an oscilloscope 50 or, alternatively, a spectrum analyzer, is connected to a current probe 55 monitoring the current flow from the plasma through the wafer pedestal 35 to ground. For this purpose, a switch can be provided to disconnect the pedestal 35 from the bias RF power source and convert the pedestal 35 directly to the ground during the measurement. The oscilloscope 50 separately displays the current measured at different frequencies by the probe. There are predominantly two frequency components in the current measured by the probe 55, namely a first component at the fundamental frequency F of the RF source 30 and a second component at the second harmonic 2F of the fundamental frequency of the RF source 30. Measuring the current of the first component (F) provides a measure of the power capacitively coupled to the plasma. Measuring the current of the second component (2F) provides a measure of the power inductively coupled to the plasma. Comparing the two provides an instantaneous indication of the apportionment of RF power between the capacitive and inductive coupling modes.

This measurement is an absolute quantity, provided the probe and oscilloscope are first calibrated carefully in accordance with well-known techniques. It is a measurement of the RF power coupled to the combination of the wafer and wafer pedestal.

During the measurement process with a plasma in the chamber, the oscilloscope 50 displays two sine waves at the frequencies F and 2F respectively. By visually observing the amplitudes of the respective sine waves, the amount of capacitive coupling and inductive coupling may be quantitatively measured. By dividing the amplitude of the component at frequency F by the amplitude of the sum of both components (at frequencies F and 2F), the amount of capacitive coupling as a fraction of all coupling is provided.

The reason the method of the invention works is that the plasma potential cycles at twice the RF frequency (2F) due to inductive coupling and cycles at the RF frequency (F) due to capacitive coupling.

The invention has been employed to great advantage in testing stray capacitive coupling in an inductively coupled plasma reactor. An invention for reducing capacitive coupling in an inductively coupled plasma reactor is described in co-pending U.S. application Ser. No. 08/480,174, filed on date even herewith by the inventors herein and entitled "INDUCTIVELY COUPLED RF PLASMA REACTOR WITH FLOATING COIL ANTENNA FOR REDUCED CAPACITIVE COUPLING". In the reactor described therein, the effect of stray capacitance from the inductive antenna is reduced by interposing an isolation transformer between the inductive antenna and the RF source. The present invention was employed to measure the reduction of stray capacitive coupling in the reactor described in the above-referenced co-pending application.

The present invention is the only known way of quantitatively determining the efficacy of the improvements in inductively coupled plasma reactors for reducing capacitive coupling, such as those described in the above-referenced co-pending applications.

The invention is useful as a method carried out during development of a plasma reactor design for minimizing stray capacitance. It is also useful as a monitoring apparatus installed on a plasma reactor to measure capacitive coupling during calibration or during actual production. Such monitoring apparatus may be useful for diagnostic purposes, process monitoring, calibration or equipment setup.

While the invention has been described in detail by specific reference to preferred embodiments, it is understood that variations and modifications may be made without departing from the true spirit and scope of the invention.

What is claimed is:

1. A plasma reactor having an inductive antenna adapted to be connected to an RF source of power operating at a desired frequency, a reactor chamber and a wafer support pedestal inside the chamber, said reactor comprising:

a frequency discriminator having as its input a signal representative of plasma current flow and capable of separating such a signal into a fundamental frequency component output and a second harmonic frequency component output;

whereby a measurement of the fundamental component output and the second harmonic output provides an indication of the apportionment of RF power between capacitive coupling and inductive coupling.

2. The reactor of claim 1 further comprising a current measurer for said fundamental frequency component output.

3. The reactor of claim 2 wherein said current measurer is an amp meter.

4. The reactor of claim 1 wherein said frequency discriminator comprises an oscilloscope.

5. The reactor of claim 1 wherein said frequency discriminator comprises a spectrum analyzer.

6. In an inductively coupled plasma reactor having an inductive antenna connected to an RF source of a frequency F, a reactor chamber and a wafer pedestal inside the chamber, a method of measuring capacitive coupling of RF energy to the wafer pedestal, comprising:

measuring a signal representative of plasma current flow;

separating said representative signal into respective frequency components including a first component at said frequency F and a second component at twice said frequency F; and sensing the amplitude of said first component.

7. The method of claim 6 further comprising the step of measuring the amount of RF power inductively coupled to said wafer pedestal, comprising:

sensing the amplitude of said second component.

8. The method of claim 7 further comprising producing a proportional measurement of inductive and capacitive coupling by comparing the amplitudes of said first and second components.

9. An inductively coupled plasma reactor, comprising:

a reactor chamber with means for introducing a processing gas into said chamber and a pedestal for supporting a semiconductor substrate inside said chamber;

an inductively coupled antenna adjacent said chamber for producing a plasma from said gas by inductive coupling of RF power;

a plasma source power RF generator coupled to the antenna and having a fundamental RF frequency F;

means for quantitatively measuring a capacitively coupled component of said inductively coupled RF power.

10. The reactor of claim 9 wherein said means for quantitatively measuring comprises:

a conductor connected between said pedestal and ground;

a current probe adjacent said conductor; and means for observing a component of current through said conductor at a frequency equal to said fundamental frequency.

11. The reactor of claim 10 wherein said means for observing comprises an oscilloscope.

12. The reactor of claim 10 wherein said means for observing comprises a spectrum analyzer.

13. In an inductively coupled plasma reactor having an inductive antenna connected to an RF source of a frequency F, a reactor chamber and a wafer pedestal inside the chamber, a method of measuring capacitive coupling of RF energy to the wafer pedestal relative to inductive coupling, comprising:

measuring current from said plasma to said wafer pedestal to provide a current measurement;

separating said current measurement into respective frequency components including a first component corresponding to capacitive coupling and a second component corresponding to inductive coupling; and sensing the respective amplitudes of said first and second components and providing a measurement of said capacitive coupling as a fraction of a whole equal to said first component divided by the sum of said first and second components.

14. The reactor of claim 1 wherein the signal representative of plasma current flow comprises a signal indicative of the current flowing through the wafer support pedestal to ground.

15. The reactor of claim 14, further comprising:

a bias RF power source connectable to the wafer support pedestal; and a switch for switchably connecting the pedestal to one of (i) the bias RF power source, and (ii) ground, wherein said switch connects the pedestal to ground whenever the signal indicative of the current flowing through the pedestal to ground is inputted to the frequency discriminator.

16. The method of claim 6 wherein the step of measuring a signal representative of plasma current flow comprises measuring a signal indicative of the current flowing through the wafer support pedestal to ground.

17. The method of claim 16, wherein the reactor further comprises a bias RF power source connectable to the wafer support pedestal and a switch for switchably connecting the pedestal to one of (i) the bias RF power source, and (ii) ground, the method further comprising the step of connecting the pedestal to ground with the switch whenever the signal indicative of the current flowing through the pedestal to ground is measured.

18. The reactor of claim 9 wherein said means for quantitatively measuring comprises means for measuring a signal representative of plasma current flow.

19. The reactor of claim 18 wherein said measuring means measures a signal indicative of the current flowing through the wafer support pedestal to ground.

20. The reactor of claim 19, further comprising:

a bias RF power source connectable to the pedestal; and a switch for switchably connecting the pedestal to one of (i) the bias RF power source, and (ii) ground, wherein said switch connects the pedestal to ground whenever the signal indicative of the current flowing through the pedestal to ground is measured by the measuring means.

* * * * *